United States Patent
Murakami

(10) Patent No.: US 11,933,642 B2
(45) Date of Patent: Mar. 19, 2024

(54) TWO-WIRE DISPLACEMENT SENSOR DEVICE AND DISPLACEMENT DETECTION SYSTEM

(71) Applicant: Hitachi Astemo, Ltd., Hitachinaka (JP)

(72) Inventor: Yosuke Murakami, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 267 days.

(21) Appl. No.: 17/559,099

(22) Filed: Dec. 22, 2021

(65) Prior Publication Data
US 2022/0113166 A1 Apr. 14, 2022

Related U.S. Application Data

(63) Continuation of application No. PCT/JP2019/030280, filed on Aug. 1, 2019.

(51) Int. Cl.
*G01D 5/20* (2006.01)
*H03B 5/08* (2006.01)
*H05K 1/18* (2006.01)

(52) U.S. Cl.
CPC ............... *G01D 5/20* (2013.01); *H03B 5/08* (2013.01); *H05K 1/181* (2013.01); *H05K 2201/10151* (2013.01)

(58) Field of Classification Search
CPC . G01D 5/20; H03B 5/08; H05K 1/181; H05K 2201/10151
See application file for complete search history.

(56) References Cited

U.S. PATENT DOCUMENTS

| 9,097,558 B2* | 8/2015 | Niwa | G01D 5/2013 |
| 2016/0265943 A1 | 9/2016 | Murakami | |
| 2016/0265945 A1 | 9/2016 | Murakami | |
| 2016/0288867 A1* | 10/2016 | Murakami | B62J 45/42 |

FOREIGN PATENT DOCUMENTS

| JP | 05256604 A | 10/1993 |
| JP | 07286875 A | 10/1995 |
| JP | 2008268016 A | 11/2008 |
| JP | 6450611 B2 | 9/2016 |
| JP | 2016166845 A | 9/2016 |

OTHER PUBLICATIONS

International Search Report dated Oct. 21, 2019 for the corresponding International Patent Application No. PCT/JP2019/030280.
Written Opinion dated Oct. 21, 2019 for the corresponding International Patent Application No. PCT/JP2019/030280.

* cited by examiner

*Primary Examiner* — Stephanie E Bloss
*Assistant Examiner* — Michael A Harrison
(74) *Attorney, Agent, or Firm* — Leason Ellis LLP; Edward J. Ellis; Melvin C. Garner

(57) ABSTRACT

A two-wire displacement sensor device includes an LC oscillation circuit including a coil whose inductance changes in accordance with a displacement amount of an object and an oscillation unit provided with capacitors and amplifying elements; and an interface unit serving as a signal output unit and a power supply input unit. The interface unit includes a constant current circuit that outputs at least two current values.

12 Claims, 8 Drawing Sheets

TWO-WIRE DISPLACEMENT SENSOR DEVICE AND DISPLACEMENT DETECTION SYSTEM

CROSS-REFERENCE TO RELATED APPLICATION

This application is a Continuation of International Application No. PCT/JP2019/030280, filed on Aug. 1, 2019, the content of which is incorporated herein by reference in its entirety.

FIELD OF THE INVENTION

The present invention relates to a two-wire displacement sensor device that detects a change in a frequency of an LC oscillation circuit to detect a displacement of an object and uses a communication line such as two wires to connect to an external device or the like, a displacement detection system using the sensor device, and the like.

BACKGROUND OF THE INVENTION

A vehicle such as a motorcycle includes a suspension for appropriately reducing a vibration transmitted from a road surface to a vehicle body during traveling and improving riding comfort and steering stability. A stroke amount can be known by attaching a stroke sensor to the suspension.

Patent Literature 1 discloses an example in which an LC oscillation stroke sensor for an electronically controlled suspension is mounted on a motorcycle. Patent Literature 2 discloses a two-wire wheel speed sensor.

Patent Literature 1: Japanese Patent NO. 6450611
Patent Literature 2: JP-A-2008-268016

An LC oscillation circuit includes an LC resonance circuit and a drive unit provided with an amplifier or the like constituting a positive feedback circuit for maintaining an LC resonance. In an LC oscillation displacement sensor in the related art, a coil is disposed in the vicinity of an object, and the drive unit is disposed in, for example, an electronic control unit (hereinafter, may be referred to as an "ECU") of a vehicle. With such a configuration, it is required to provide the drive unit in the ECU of the vehicle, and it is undeniable that an internal configuration of the ECU becomes complicated. The ECU may also be referred to as an electronic device having a control function.

When it is required to install the coil and the drive unit at different positions, a burden on an operator in charge of the attachment of the sensor may be increased.

In a two-wire sensor, one wire is a ground line, and the other wire is used to supply a power supply voltage and extract a voltage signal. In a case where the voltage signal output from the sensor is transmitted to the ECU or the like, when noises are superimposed on the voltage signal, a signal waveform may be distorted. Since the voltage signal is transmitted through a line having a finite impedance, it is usually difficult to reduce an output impedance. Therefore, the influence of the noises cannot be avoided to some extent.

SUMMARY OF THE INVENTION

An object of the present invention is to provide a two-wire displacement sensor device and the like that can prevent an internal configuration of an electronic device having a control function from becoming complicated.

As a result of intensive studies, the present inventors changed an output method of a detection signal of the sensor from a signal output having a voltage waveform in the related art to a signal output having a current waveform, and determined a current amplitude according to the presence or absence of a constant current by turning on or turning off a constant current circuit. A current amplitude of an output signal having a current waveform with a current amplitude of a constant current is uniformly determined by the constant current and is constant even when noises are superimposed. Therefore, it has been found that (1) a signal output is changed to a signal output having a current waveform, so that the signal output is resistant to noises, in other words, an output impedance is low, an ability to cancel the noises is high, and thus the waveform is less likely to be distorted. It has also been found that (2), in the ECU or the like, a pull-down resistor or the like can be used to convert a current into a voltage pulse and the voltage pulse can be extracted, so that the internal configuration can be simplified. The present invention has been completed based on this finding.

Hereinafter, the present invention will be described. In the following description, for ease of understanding of the present invention, reference numerals in the accompanying drawings are appended in parentheses, but the present invention is not limited to the shown embodiments.

According to an aspect of the present invention, there is provided a two-wire displacement sensor device (110). The two-wire displacement sensor device (110) includes
an LC oscillation circuit (109) including a coil (CL1) whose inductance changes in accordance with a displacement amount of an object (M1) and an oscillation unit (102) provided with capacitors (C30 to C32) and amplifying elements (INV1 and INV2), and
an interface unit (108) serving as a signal output unit and a power supply input unit,
in which the interface unit includes a constant current circuit (111) that outputs at least two current values.
The constant current circuit includes
a first constant current circuit (J1) that is connected between a first wire (L1) and a second wire (L2) and is configured to output an alternating current signal (Ic) having a current waveform to the first wire when the first constant current circuit (J1) is switched between an ON state and an OFF state based on an alternating current signal having a voltage waveform obtained from the LC oscillation circuit,
a second constant current circuit (J2) that is connected between the first wire and the second wire and is constantly turned on, and
a smoothing capacitor (CP) that is connected between the second wire and a reference potential line and is configured to generate a power supply voltage (VQ) of the oscillation unit.

The first wire serves as a current signal output line that outputs the alternating current signal having the current waveform and a direct current power supply voltage input line to which a direct current power supply voltage is input.

The interface unit (108) may include an input and output terminal (T1) to which the first wire (L1) is connected, that inputs the direct current power supply voltage, and that outputs the alternating current signal having the current waveform, and
a connection point (N2) between the second constant current circuit (J2) and the first wire may be provided at a position farther away from the input and output terminal than a connection point (N1) between the first constant current circuit (J1) and the first wire.

A constant current amount (IS2) of the second constant current circuit (J2) may be set to be larger than a constant current amount (IS1) of the first constant current circuit (J1).

Each of the first constant current circuit (J1) and the second constant current circuit (J2) may be configured with at least one constant current diode (D2, D3).

At least one constant voltage diode (ZD) may be connected between the second wire (L2) and the reference potential line (L3), a total current obtained by adding currents flowing out from the first constant current circuit (J1) and the second constant current circuit (J2) may flow to the reference potential line via the constant voltage diode to generate a predetermined constant voltage at two ends of the constant voltage diode, and a surplus current exceeding a current amount required to generate the constant voltage may flow to the reference potential line, and the constant voltage generated by the constant voltage diode may be smoothed by the smoothing capacitor (CP) to generate the power supply voltage of the oscillation unit (102).

The two-wire displacement sensor device (110) may further include a waveform shaping unit (104) configured to shape a waveform of the alternating current signal having the voltage waveform output from the LC oscillation circuit (109), in which the first constant current circuit (J1) in the interface unit (108) may be switched between an ON state and an OFF state based on a pulse signal obtained by the waveform shaping, or the two-wire displacement sensor device (110) may further include a waveform shaping unit configured to shape a waveform of the alternating current signal having the voltage waveform output from the LC oscillation circuit, and a frequency dividing unit (106) configured to divide a frequency of a pulse signal obtained by the waveform shaping, in which the first constant current circuit in the interface unit may be switched between an ON state and an OFF state based on a pulse signal obtained by the waveform shaping.

The object (M1) may be a component (206) of a shock absorber (22), and the two-wire displacement sensor device (110) may be a stroke sensor device (250) that measures a displacement amount of the shock absorber by detecting a frequency of the LC oscillation circuit (109) that varies in accordance with a relative positional relationship between the component of the shock absorber and the coil (CL1).

The coil (CL1) of the LC oscillation circuit (109) may be attached to a cylindrical body (220), the oscillation unit (102) of the LC oscillation circuit may be formed on a circuit board (300), and the circuit board may be fixed to an extending portion (230) that extends from the cylindrical body to an outer side in a radial direction of the cylindrical body.

The circuit board (300) may be sealed by a sealing material (302) at the extending portion (230).

According to another aspect of the present invention, there is provided a displacement detection system (150). The displacement detection system (150) includes a two-wire displacement sensor device (110) according to the first aspect of the present invention, and an electronic control unit (10) including a current and voltage conversion unit (5) configured to convert the alternating current signal having the current waveform output from the two-wire displacement sensor device into an alternating current signal having a voltage waveform, and a detection unit (7) configured to detect a displacement amount of the object (M1) by observing a frequency of the alternating current signal having the voltage waveform after the conversion.

The displacement detection system (150) may be a shock absorber displacement detection system (160) that detects a displacement of the shock absorber (22).

According to another aspect of the present invention, there is provided a displacement detection system (150) using a two-wire stroke sensor (110). The displacement detection system (150) includes an LC oscillation circuit (109) including a coil (CL1) whose inductance changes in accordance with a stroke amount of a shock absorber (22) of a straddle type vehicle, and an oscillation unit (102) provided with capacitors (C30 to C32) and amplifying elements (INV1 and INV2), an interface unit (108) serving as a signal output unit that outputs an alternating current signal having a current waveform to the first wire (L1) and a power supply input unit to which a direct current power supply voltage is input, and an electronic control unit (10) including a current and voltage conversion unit (5) configured to convert the alternating current signal having the current waveform into an alternating current signal having a voltage waveform, and a detection unit (7) configured to detect the stroke amount by observing a frequency of the alternating current signal having the voltage waveform after the conversion.

The interface unit includes a first constant current circuit (J1) that is connected between the first wire and a second wire (L2) and is configured to output the alternating current signal (Ic) having the current waveform to the first wire when the first constant current circuit (J1) is switched between an ON state and an OFF state based on the alternating current signal having the voltage waveform obtained from the LC oscillation circuit, a second constant current circuit (J2) that is connected between the first wire and the second wire and is constantly turned on, and a smoothing capacitor (CP) that is connected between the second wire and a reference potential line (L3) and is configured to generate a power supply voltage (VQ) of the oscillation unit.

The first wire serves as a current signal output line that outputs the alternating current signal having the current waveform and a direct current power supply voltage input line to which the direct current power supply voltage is input.

The interface unit further includes an input and output terminal (T1) to which the first wire is connected, that inputs the direct current power supply voltage, and that outputs the alternating current signal having the current waveform.

A connection point (N2) between the second constant current circuit and the first wire is provided at a position farther away from the input and output terminal than a connection point (N1) between the first constant current circuit and the first wire, a constant current amount (IS2) of the second constant current circuit is set to be larger than a constant current amount (IS1) of the first constant current circuit, and each of the first constant current circuit and the second constant current circuit is configured with at least one constant current diode (D2, D3).

The interface unit further includes at least one Zener diode (ZD) connected between the second wire and the reference potential line,
- a total current obtained by adding currents flowing out from the first constant current circuit and the second constant current circuit flows to the reference potential line via the Zener diode to generate a predetermined constant voltage at two ends of the Zener diode, and a surplus current exceeding a current amount required to generate the constant voltage flows to the reference potential line, and
- the constant voltage generated by the Zener diode is smoothed by the smoothing capacitor to generate the power supply voltage of the oscillation unit.

According to the present invention, it is possible to provide a two-wire displacement sensor device and the like that can prevent an internal configuration of an electronic device having a control function from becoming complicated.

DETAILED DESCRIPTION OF THE INVENTION

Embodiments of the present invention will be described below with reference to the accompanying drawings. The embodiments shown in the accompanying drawings are examples of the present invention, and the present invention is not limited to the embodiments.

First Embodiment

Figure 1A:
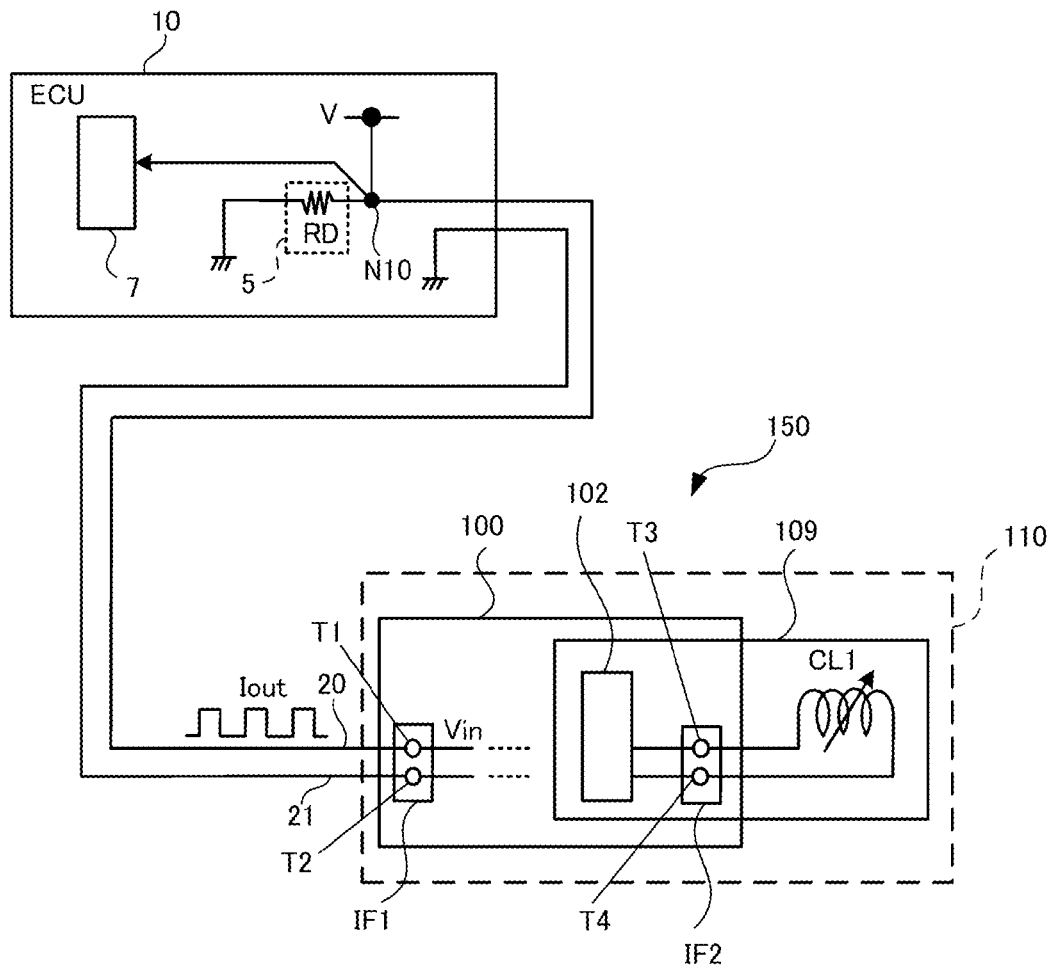
FIG. 1A is a diagram showing an example of a configuration of a displacement detection system 150 using a two-wire displacement sensor device 110.

Description will be made with reference to FIG. 1A. FIG. 1A is a diagram showing an example of a configuration of a displacement detection system using a two-wire displacement sensor device. As shown in FIG. 1A, components of a displacement detection system 150 include a two-wire displacement sensor device (hereinafter, may be simply referred to as a "sensor") 110, an electronic control unit (ECU) 10 serving as a control unit, and two connection lines 20 and 21 that are formed of conductors and connect the sensor 110 and the ECU 10. The connection lines 20 and 21 are formed of, for example, a wire harness or the like.

The two-wire displacement sensor device 110 includes an LC oscillation circuit 109 and a sensor main body 100. The LC oscillation circuit 109 includes a coil CL1 whose inductance changes in accordance with a displacement amount of an object, a coil-side interface IF2, and an oscillation unit 102. The interface IF2 has terminals T3 and T4. The oscillation unit 102 includes, for example, a capacitor and an amplifying element. The coil CL1 may also be referred to as a resonance coil.

The sensor main body 100 is a portion including components other than the coil CL1 among the components of the two-wire displacement sensor device 110. The sensor main body 100 includes an ECU-side interface IF1. The interface IF1 has terminals T1 and T2. The terminal T1 is a terminal that outputs an alternating current signal Iout having a current waveform to the ECU 10 and to which a direct current power supply voltage Vin for the sensor main body 100 supplied from the ECU 10 is input. The alternating current signal Iout having a current waveform may be referred to as a detection output signal.

The alternating current signal Iout having a current waveform is a current signal whose frequency changes in accordance with a variation of an inductance of the coil CL1. As will be described later, a current amplitude of the current signal is determined by a constant current amount of a constant current source that is turned on or turned off. The current signal may be referred to as a current pulse signal.

The terminal T2 is a terminal to which a reference potential line 21 is connected. Here, the reference potential is a potential serving as a reference of an operation of a circuit, and is generally a ground potential. Another direct current potential may be used. The reference potential line is a ground line in the present embodiment.

The ECU 10 includes a pull-down resistor (hereinafter, may be simply referred to as a "resistor") RD connected to a power supply potential V. The pull-down resistor RD constitutes a conversion unit 5 that converts the alternating current signal Iout having a current waveform output from the two-wire displacement sensor device 110 into an alternating current signal having a voltage waveform. The pull-down resistor RD is not limited to a single resistor, and may be, for example, a voltage dividing resistor in which a plurality of resistors are combined. The power supply potential V is 12V in the present embodiment. The alternating current signal Iout having a current waveform can also be referred to as a current pulse signal serving as a detection output signal. The resistor can also be referred to as a resistor body.

A detection unit 7 is connected to a node N10 of the pull-down resistor RD at the power supply potential V side. The detection unit 7 is a signal processing unit that detects a displacement amount of an object by observing a frequency of the alternating current signal having a voltage waveform that is converted from the alternating current signal having a current waveform. In other words, the alternating current signal having a voltage waveform is a voltage pulse signal.

Figure 1B:
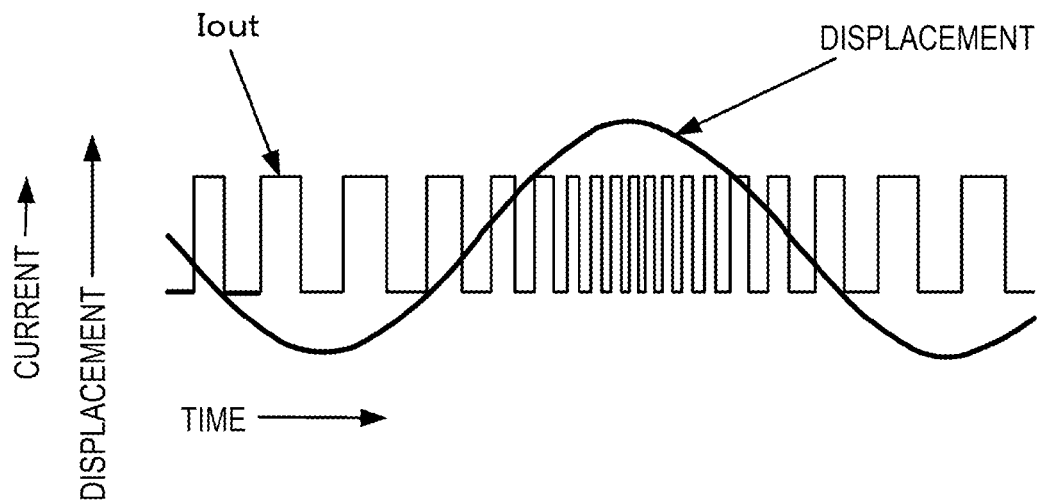
FIG. 1B is a diagram showing a state of a detection signal of the two-wire displacement sensor device, in which the detection signal changes in accordance with a displacement of an object.

Description will be made with reference to FIG. 1B. FIG. 1B is a diagram showing a state of a detection signal of the two-wire displacement sensor device, in which the detection signal changes in accordance with a displacement amount of an object. In FIG. 1B, a vertical axis represents a displacement amount and a current amount, and a horizontal axis represents a time axis. In the drawing, the displacement of the object is drawn as a periodically changing curve such as a sine curve. Since an amount of an eddy current changes in accordance with the displacement amount and an inductance value of the coil CL1 changes, the current pulse signal Iout is a signal having a current waveform in which a frequency, in other words, a cycle of the current pulse signal periodically varies on the time axis that is the horizontal axis. The displacement amount of the object is, for example, a stroke amount.

The conversion unit 5 in FIG. 1A converts the current pulse signal Iout into a voltage. The detection unit 7 serving as a signal processing unit analyzes a frequency of the voltage pulse signal to acquire frequency information, and detects the displacement of the object based on the acquired frequency information. The frequency information may be any information such as a frequency, a displacement amount of a frequency, and a change rate of a frequency. In other words, the conversion unit 5 is a pull-down resistor RD.

According to the configuration in FIG. 1A, the sensor main body 100 constituting the LC oscillation circuit can be formed integrally with the coil CL1. For example, a pull-down resistor RD may be provided inside the ECU 10. Therefore, an internal configuration of the ECU 10 can be simplified. The ECU 10 is an electronic device having a control function in a broad sense. Therefore, the ECU 10 can be referred to as a control unit. The oscillation unit 102 is built in the sensor main body 100.

A current amplitude of the current pulse signal Iout is accurately determined by a current amount of a first constant current source Dis1 that is switched between an ON state and an OFF state. Therefore, a signal has a low output impedance, a waveform is less likely to be deformed by a noise, and a noise resistance characteristic is enhanced. Therefore, it is possible to prevent a decrease in signal quality. The matter that the current amplitude of the current pulse signal Iout is accurately determined by the current amount of the first constant current source Dis1 will be described in detail later.

The sensor main body 100 and the ECU 10 can be connected using the two connection lines 20 and 21. The connection line 20 is a line that transmits a current signal, and is a power supply line that supplies a power supply voltage for the sensor main body 100 from the ECU 10 to the sensor main body 100. Therefore, the LC oscillation type displacement sensor device 110 shown in FIG. 1B can be referred to as a two-wire displacement sensor device. The power supply voltage for the sensor main body 100 is a direct current power supply voltage.

Figure 2:
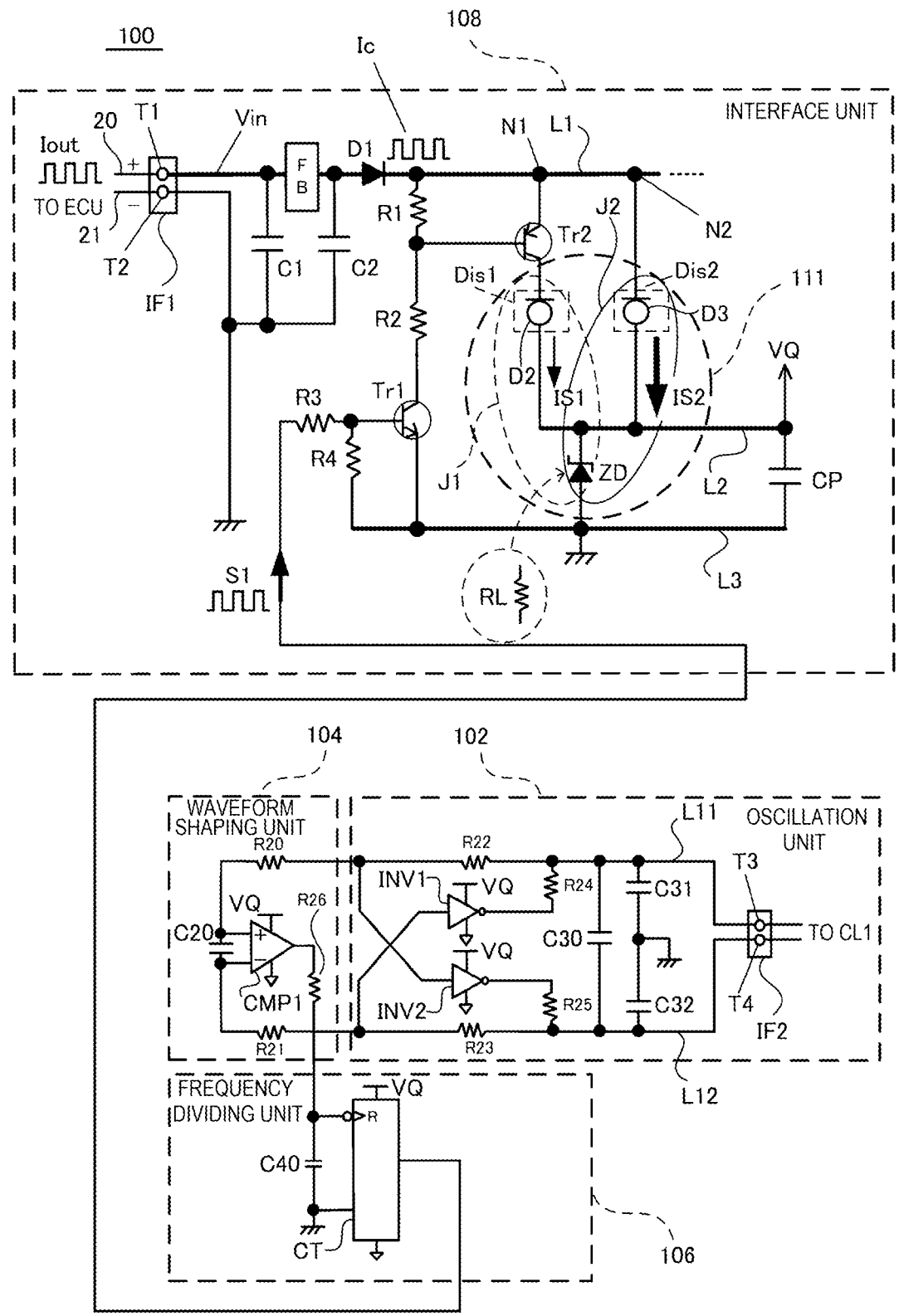
FIG. 2 is a diagram showing an example of an overall circuit configuration of a sensor main body in the two-wire displacement sensor device 110.

Next, description will be made with reference to FIG. 2. FIG. 2 is a diagram showing an example of an overall circuit configuration of the sensor main body 100 in the two-wire displacement sensor device 110 shown in FIG. 1A.

The sensor main body 100 shown in FIG. 2 includes an interface unit 108, a frequency dividing unit 106, a waveform shaping unit 104, and the oscillation unit 102. The frequency dividing unit 106 may be omitted.

The oscillation unit 102 includes a coil-side interface IF2, a capacitor C31 of which one end is connected to the ground potential and the other end is connected to a wire L11, a capacitor C32 of which one end is connected to the ground potential and the other end is connected to a wire L12, a capacitor C30 of which one end is connected to the wire L11 and the other end connected to the wire L12, two inverters INV1 and INV2 cross-coupled to form a positive feedback circuit, and resistors R22, R23, R24, and R25. A power supply voltage of each of the inverters INV1 and INV2 is VQ. The oscillation unit 102 is a Franklin oscillator using an inverter. A type of the oscillator is not limited. The oscillator is not particularly limited as long as the oscillator performs an LC oscillation. For example, a Colpitts oscillator may be used. The inverter can be referred to as an amplifying element. The power supply voltage VQ of each of the inverters INV1 and INV2 is, for example, 5V.

The waveform shaping unit 104 includes an input capacity C20, a comparator CMP1, resistors R20 and R21, and a resistor R26. The resistor R26 is a resistor connected to an output terminal of the comparator CMP1. The comparator CMP1 is operated at the power supply voltage VQ. An output signal of the comparator CMP1 is a waveform-shaped voltage pulse signal having steep rising and falling edges.

The frequency dividing unit 106 includes a capacitor C40 and a counter CT. The capacitor C40 functions as an input holding capacitor. A frequency dividing ratio n of the counter CT can be changed to, for example, 16, 32, 64, 128, and 256. The counter CT is operated at the power supply voltage VQ. The counter CT may use, for example, a binary counter.

The interface unit 108 includes a constant current circuit 111 that outputs at least two current values. In other words, a value of a constant current generated by the constant current circuit 111 may have at least two values. The value of the constant current is not limited to have two values, and may have three or more values.

The constant current circuit 111 includes a first constant current circuit J1 that is connected between a first wire L1 and a second wire L2. The first constant current circuit J1 outputs a current pulse signal Ic which is an alternating current signal having a current waveform to the first wire L1 when the first constant current circuit J1 is switched between an ON state and an OFF state based on a voltage pulse signal S1 that is an alternating current signal having a voltage waveform obtained from the LC oscillation circuit 109.

The constant current circuit 111 includes a second constant current circuit J2 that is connected between the first wire L1 and the second wire L2 and is constantly turned on. In FIG. 2, the first constant current circuit J1 is a portion surrounded by a dashed ellipse. The second constant current circuit J2 is a portion surrounded by a solid ellipse.

The interface unit 108 includes a smoothing capacitor CP that is connected between the second wire L2 and a reference potential line L3 that is a third wire and generates a power supply voltage VQ of the oscillation unit 102.

The first wire L1 also serves as a current signal output line that outputs the current pulse signal Ic which is an alternating current signal having a current waveform, and a direct current power supply voltage input line to which a direct current power supply voltage is input.

The first constant current circuit J1 includes the constant current source Dis1 and a resistor RL or a constant voltage diode ZD serving as a current load. The constant current source Dis1 is provided between the first wire L1 and the second wire L2, and is connected to the first wire L1 via a PNP transistor Tr2 serving as a switch. When the PNP transistor Tr2 serving as a switch is turned on or turned off, a constant current IS1 generated by the constant current source Dis1 is turned on or turned off.

The second constant current circuit J2 includes a constant current source Dis2 that is constantly turned on, and a resistor RL or a constant voltage diode ZD serving as a current load.

The interface unit 108 further includes a circuit provided with an NPN transistor TR1 and resistors R1 and R2 that are used to turn on or turn off the PNP transistor Tr2, a resistor circuit provided with resistors R3 and R4 that are used to apply a voltage to a base of the NPN transistor Tr1, and a diode D1 that prevents a reverse flow of a current.

The interface unit 108 includes ferrite beads FB serving as a noise countermeasure component, stabilization capacitors C1 and C2, and an ECU-side interface IF1. The ECU-side interface IF1 includes terminals T1 and T2.

The resistor RL or the constant voltage diode ZD serving as a current load included in the constant current circuit 111 is a current load common to the first constant current circuit J1 and the second constant current circuit J2. In other words, the resistor RL or the constant voltage diode ZD serving as a current load is a common component for the first constant current circuit J1 and the second constant current circuit J2. Preferred layout configurations and preferred layout settings of the first constant current circuit J1 and the second constant current circuit J2 will be described later with reference to FIG. 3. The current load can also be referred to as a current load circuit.

The constant current source Dis1 can be implemented by a constant current diode D2. Similarly, the constant current source Dis2 can also be implemented by a constant current diode D3. A constant current source can be configured with a simple configuration by using a constant current diode. A usage of the constant current diode contributes to miniaturization of a circuit. A configuration in which the constant current sources Dis1 and Dis2 are implemented by constant current diodes is an example, and a constant current source having other configurations may be used. For example, a current mirror may be used. In the following description, the constant current source Dis1 may be referred to as a first constant current source, and the constant current source Dis2 may be referred to as a second constant current source.

In FIG. 2, a current of the first constant current source Dis1 and a current amount of the first constant current source Dis1 are described as IS1, and a current of the second constant current source Dis2 and a current amount of second constant current source Dis2 are described as IS2.

In the circuit in FIG. 2, an input direct current power supply voltage is Vin, and Vin is 12V. The direct current power supply voltage Vin can be referred to as a first power supply voltage. On the other hand, the power supply voltage VQ that is suitable for the sensor main body 100 and is generated using the first power supply voltage is 5V. That is, a level shift from 12V to 5V is required. The power supply voltage VQ is a voltage obtained from the second wire L2. For the sake of convenience, the power supply voltage VQ may be referred to as a power supply voltage for the sensor main body 100 or a power supply voltage for the oscillation unit 102. The NPN transistor Tr1 is a first switching transistor, and the PNP transistor Tr2 is a second switching transistor.

The first switching transistor Tr1 is turned on when the voltage pulse signal S1 that is a voltage signal having an alternating current waveform is at a high level, and is turned off when the voltage pulse signal S1 is at a low level. When the first switching transistor Tr1 is turned on, a current flows through the resistors R1 and R2. As a result, a voltage drop occurs in the resistor R1, and the second switching transistor Tr2 is forward-biased and is turned on. When the second switching transistor Tr2 is turned on, the first constant current source Dis1 is connected to the first wire L1 and is brought into an operable state, and the current IS1 flows through the first constant current source Dis1. When the first switching transistor Tr1 is turned off, the second switching transistor Tr2 is turned off, and the current IS1 does not flow through the first switching transistor Tr1 and the second switching transistor Tr2.

Here, the second constant current source Dis2 is constantly turned on, and the current IS2 flows through the second constant current source Dis2. The current IS1 is switched between an ON state and an OFF state in accordance with an ON state and an OFF state of the second switching transistor Tr2, so that the current amplitude of the current pulse signal Ic that is a signal having a current waveform is accurately determined. The current amplitude is constantly determined by the current IS1 that is a constant current generated by a constant current source. The current pulse signal Ic has a low output impedance. Even when noises are superimposed, the waveform is less likely to be distorted. Therefore, even in a noise environment, the signal quality is maintained higher than the signal quality of a signal having a voltage waveform.

The connection line 20 such as a wire is connected to the terminal T1 of the ECU-side interface IF1, and the direct current power supply voltage Vin is obtained via the terminal T1. The current pulse signal Iout generated by the above-described operation is output to the ECU 10 via the terminal T1.

As described above, the first switching transistor Tr1 is switched by the pulse signal S1. In the circuit shown in FIG. 2, when the frequency dividing unit 106 is omitted, an ON state and an OFF state of the first constant current circuit J1 in the interface unit 108 are switched based on a voltage pulse signal obtained by a waveform shaping processing executed by the waveform shaping unit 104. When the frequency dividing unit 106 is not omitted, an ON state and an OFF state of the first constant current circuit J1 in the interface unit 108 are switched based on a pulse signal after frequencies are divided by the frequency dividing unit 106. The pulse signal can be referred to as a voltage pulse signal.

Figure 3:
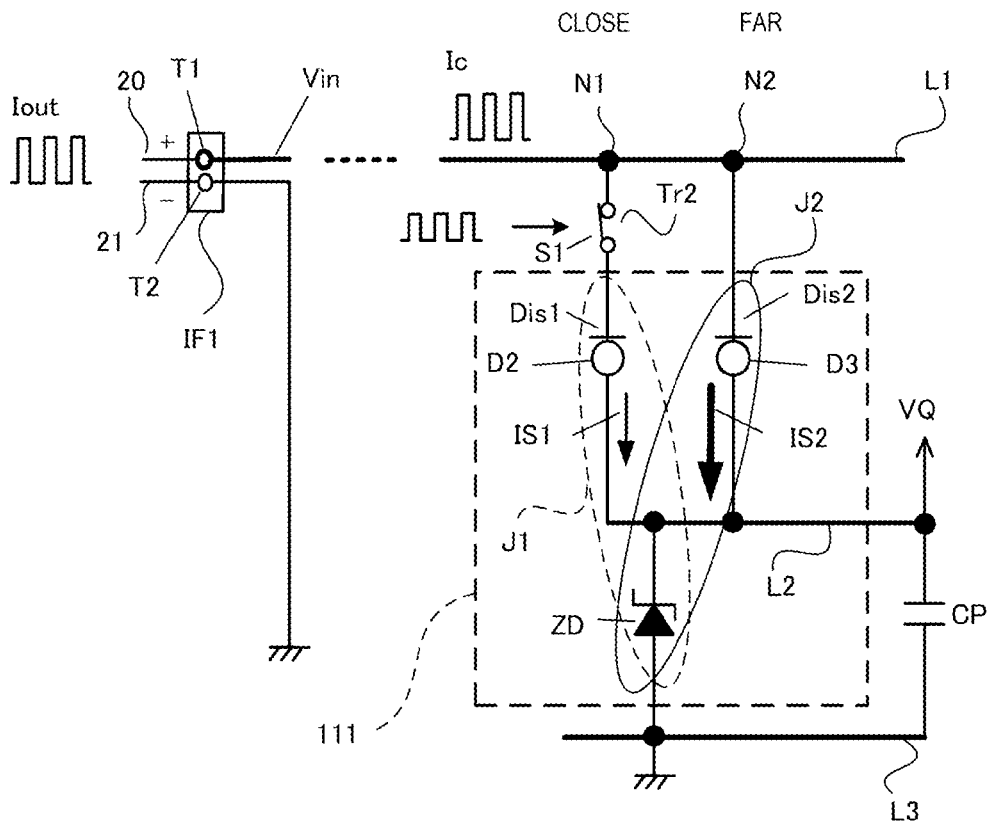
FIG. 3 is a diagram showing a preferable example of a layout of two constant current sources.

Next, description will be made with reference to FIG. 3. FIG. 3 is a diagram showing a preferable example of a layout of two constant current sources. In FIG. 3, the same reference numerals are given to the same components as those in the above-described drawings. In FIG. 3, the transistor Tr2 is simplified as a switch.

As described above, the interface unit 108 has the input and output terminal T1 for inputting a direct current power supply voltage and outputting an alternating current signal having a current waveform. The first wire L1 is connected to the input and output terminal T1. Hereinafter, the input and output terminal T1 may be simply referred to as a terminal. In the example of FIG. 3, a connection point N2 between the second constant current circuit J2 and the first wire L1 is provided at a position farther away from the input and output terminal T1 than a connection point N1 between the first constant current circuit J1 and the first wire L1. In other words, the constant current circuit J1 in which the current is switched is positioned at a side close to the input and output terminal T1, and the constant current circuit J2 that is constantly turned on is positioned at a side far from the input and output terminal T1. In other words, the input and output terminal T1 can be referred to as the ECU-side interface IF1.

The second constant current circuit J2 is not present between the first constant current circuit J1 and the ECU-side interface IF1. Therefore, the current pulse signal Ic generated by switching the first constant current circuit J1 between an ON state and an OFF state is transmitted to the terminal T1 without being attenuated, and the detection output signal Iout with less attenuation is obtained from a terminal T11. The ECU-side interface IF1 can also be referred to as a first interface.

Figure 4A:
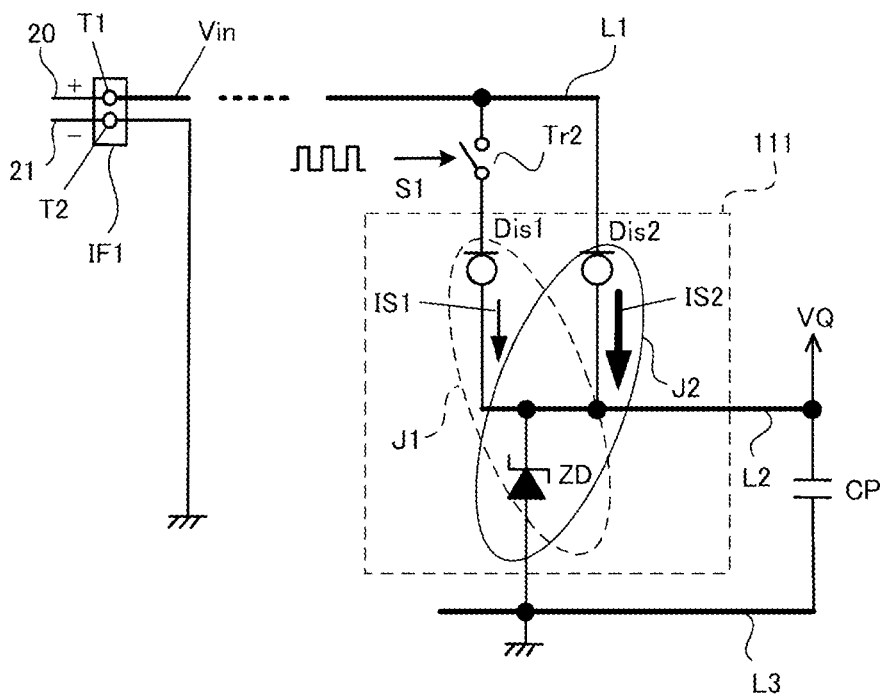
FIG. 4A is a diagram showing an example of a circuit configuration of a main part of an interface unit shown in FIG. 2.
Figure 4B:
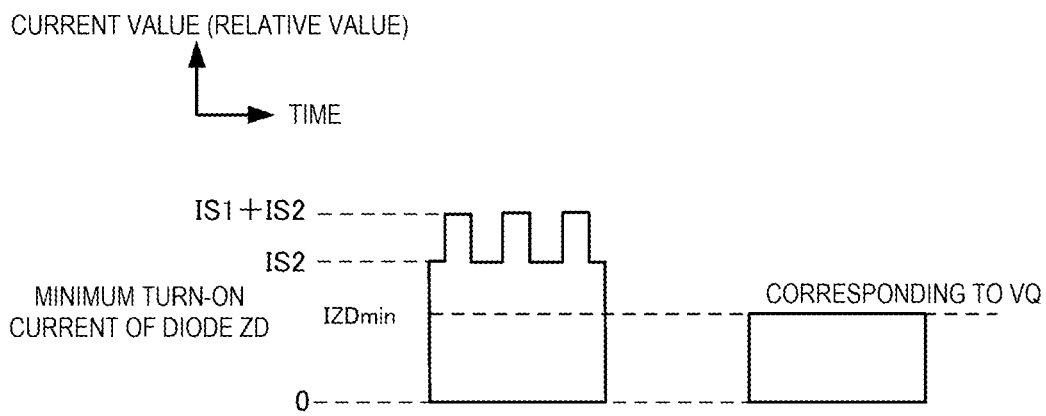
FIG. 4B is a diagram showing a principle of noise prevention and a level shift by the circuit configuration shown in FIG. 4A.

Next, description will be made with reference to FIGS. 4A and 4B. FIG. 4A is a diagram showing an example of a circuit configuration of a main part of the interface unit shown in FIG. 2, and FIG. 4B is a diagram showing a principle of noise prevention and a level shift. In FIG. 4A, the same components as those in FIG. 3 are denoted by the same reference numerals.

In FIG. 4A, at least one constant voltage diode is connected as a current load. Here, it is assumed that one Zener diode ZD is used. The Zener diode ZD is an element serving as a current load connected between the second wire L2 and the reference potential line L3. The Zener diode ZD has a function of generating a voltage by being current-biased by a total current obtained by adding the current IS1 and the current IS2. The smoothing capacitor CP is biased by the generated voltage, and the power supply voltage VQ for the sensor main body is generated at a connection point between the smoothing capacitor CP and the second wire L2. It is possible to control a value of the voltage VQ to a desired value by adjusting at least one of a total current amount and a resistance value of a current load element. The current load can be referred to as a current load element. The reference potential line can also be referred to as a third wire. The desired value of the voltage VQ is, for example, 5V.

In FIG. 4A, a constant current amount of the current IS2 of the second constant current circuit J2 is set to be larger than a constant current amount of the current IS1 of the first constant current circuit J1. In FIG. 4A, a constant voltage diode ZD is used as a current load. Therefore, when the constant voltage diode is current-biased by the total current obtained by adding the current IS1 and the current IS2, a predetermined voltage determined by a rated voltage of the constant voltage diode is generated, and a surplus current exceeding a current amount required to generate the predetermined voltage flows to the reference potential line L3 and is discarded. The above-described predetermined voltage is applied to the smoothing capacitor CP, and ripples are removed, so that the power supply voltage VQ for the sensor main body is accurately obtained. That is, the voltage VQ which is a voltage level-shifted from 12V to 5V can be generated with high accuracy. The constant voltage diode can also be referred to as a Zener diode. The reference potential line can also be referred to as a ground potential line. The power supply voltage VQ for the sensor main body is, for example, 5V.

Here, description will be made with reference to FIG. 4B. As shown at the left side of FIG. 4B, a current amount of the total current obtained by adding the current IS1 and the current IS2 periodically varies on the time axis in accordance with the switching of the current IS1 between an ON state and an OFF state. As described above, a current amplitude of the current pulse signal is accurately determined by the current IS1. In a case where IZDmin is a turn-on current that is a minimum current flowing through the constant voltage diode ZD when the current IS is turned on, the constant voltage diode ZD generates a predetermined voltage when this current amount is ensured. A surplus current exceeding the current amount flows to the ground potential line L3 which is the reference potential line. As a result, as shown at the right side of FIG. 4B, a variable component of the current accompanying with the switching of the current IS1 between an ON state and an OFF state is simultaneously removed when the surplus current is discarded. That is, when the constant voltage diode ZD generates a predetermined constant voltage, the variable component of the current is discarded as a surplus current and is masked. Therefore, the voltage VQ of a desired potential can be obtained. As shown in FIG. 2, the voltage VQ can be used as a power supply voltage for the inverters INV1 and INV2 of the oscillation unit 102, the comparator CMP of the waveform shaping unit 104, the counter CT of the frequency dividing unit 106, and the like. Therefore, since an accurate power supply voltage VQ is generated, it is ensured that each circuit performs a desired operation with high accuracy, and a highly accurate operation of the entire sensor main body 100 is ensured. Therefore, quality of the LC oscillation sensor is improved.

As described above, a total current obtaining by adding currents flowing out from the first constant current circuit J1 and the second constant current circuit J2, that is, a current obtained by adding the currents IS1 and IS2, flows to the reference potential line L3 via the constant voltage diode ZD. Accordingly, a predetermined constant voltage can be generated at two ends of the constant voltage diode ZD. Further, a surplus current exceeding a current amount required to generate the constant voltage flows to the reference potential line L3, and the constant voltage generated by the constant voltage diode ZD is smoothed by the smoothing capacitor CP, so that the power supply voltage for the sensor main body, in other words, the power supply voltage VQ of the oscillation unit 102 or the like, can be generated with high accuracy.

Figure 5:
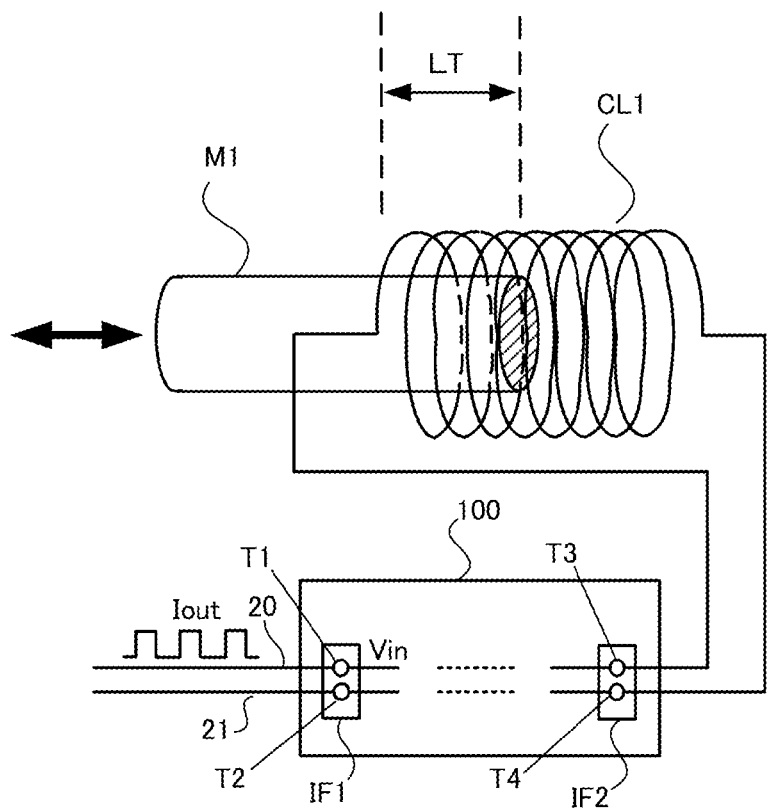
FIG. 5 is a diagram showing a principle configuration of a two-wire stroke sensor.

Next, description will be made with reference to FIG. 5. FIG. 5 is a diagram showing a principle configuration of a two-wire stroke sensor. The present invention can be achieved as a stroke sensor device that measures a displacement of an object M1. A vehicle such as a motorcycle or a four-wheel automobile is provided with a suspension. It is possible to detect a changed stroke length by detecting a displacement of components of the suspension.

In FIG. 5, the object M1 is a cylindrical conductor. Specifically, the object M1 is made of, for example, metal. The object M1 is fitted to the coil CL1 shown in FIG. 1 and the like with a fitting length LT. When the object M1 is displaced in a direction of a central axis of a cylinder, the fitting length LT varies. Accordingly, a leakage current changes, and the inductance of the coil CL1 changes. An oscillation frequency of the LC oscillation circuit 109 shown in FIG. 1 is changed due to the change in the inductance. As described above, the current pulse signal Iout whose frequency changes in accordance with the change in the oscillation frequency can be obtained. In FIG. 5, the conductor M1 is supposed to move, and the coil CL1 may also move for the sake of convenience. In other words, a relative positional relationship between the conductor M1 and the coil CL1 varies.

That is, the stroke sensor device can be achieved by adopting the principle configuration shown in FIG. 5. In other words, a displacement amount of the suspension can be measured by detecting a frequency of the LC oscillation circuit 109 that varies in accordance with the relative positional relationship between the conductor M1 and the coil CL1 that are components of the suspension.

Figure 6A:
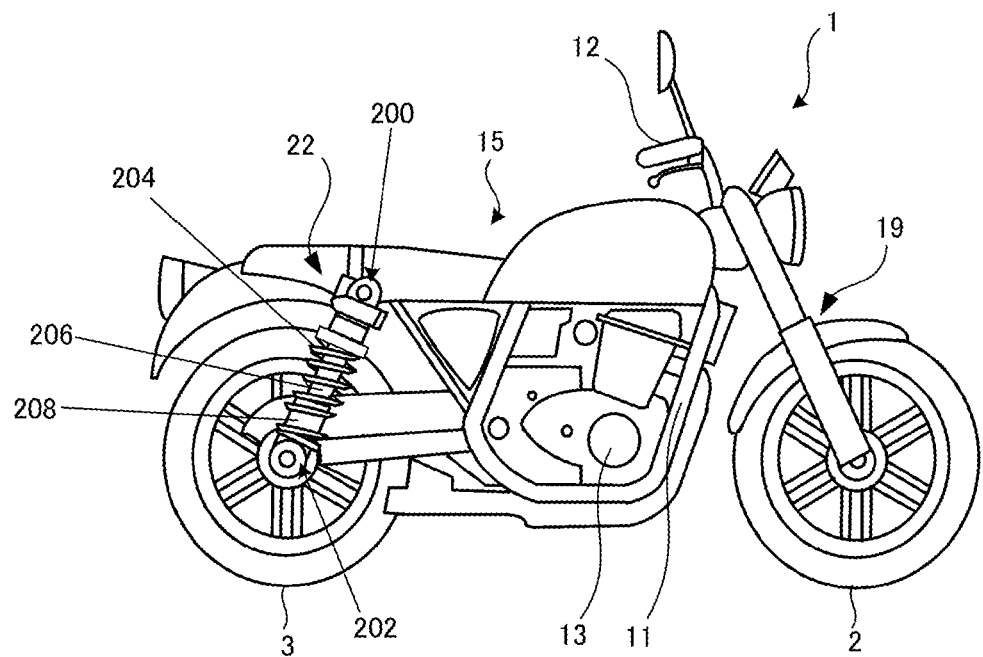
FIG. 6A is a side view of a motorcycle including a suspension.
Figure 6B:
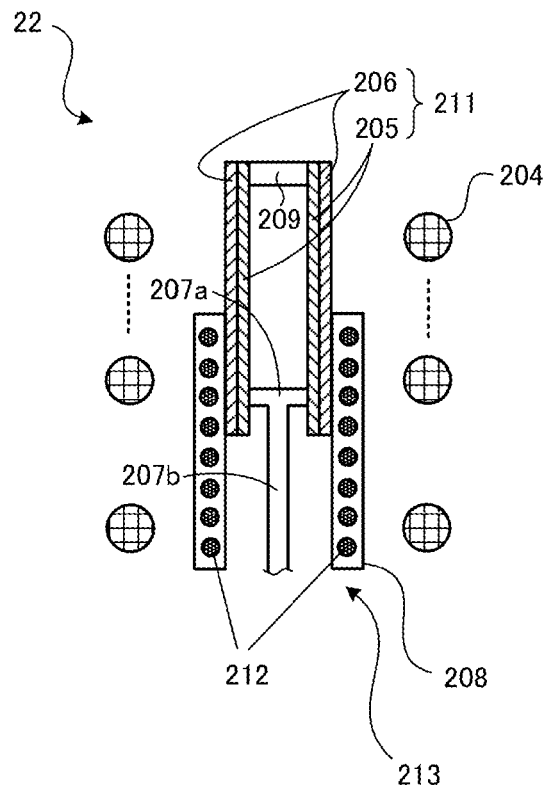
FIG. 6B is a cross-sectional view showing a configuration of a main part of a rear suspension.

Next, description will be made with reference to FIGS. 6A and 6B. FIG. 6A is a side view showing a motorcycle including a suspension, and FIG. 6B is a cross-sectional view showing a configuration of a main part of a rear suspension. Examples of the suspension include a rear suspension 22 and a front fork 19.

In FIG. 6A, the motorcycle 1 includes a front wheel 2 that is a wheel at a front side, a rear wheel 3 that is a wheel at a rear side, and a vehicle main body 15 that is provided with a vehicle body frame 11 which forms a framework of the motorcycle 1, a handle 12, an engine 13, and the like.

The motorcycle 1 further includes the front fork 19 that couples the front wheel 2 and the vehicle main body 10 at each of a left side and a right side of the front wheel 2. The motorcycle 1 further includes the rear suspension 22 that couples the rear wheel 3 and the vehicle main body 10 at each of a left side and a right side of the rear wheel 3. In FIG. 1, only the front fork 19 and the rear suspension 22 disposed at the right side are shown.

The rear suspension 22 is a hydraulic suspension. FIG. 6A shows an external configuration of the rear suspension 22. The rear suspension 22 includes a vehicle body side attachment member 200, a wheel side attachment member 202, a coil spring 204, a cylinder portion 211, and a load adjustment device 213. Although not described in detail, the cylinder portion 211 includes a cylinder 205 and an outer cylinder 206 as shown in FIG. 6B. Although not described in detail, the load adjustment device 213 includes a guide 208 as shown in FIG. 6B.

Next, description will be made with reference to FIG. 6B. As shown in FIG. 6B, the outer cylinder 206 is provided outside the cylinder 205, and the outer cylinder 206 is a constituent element of the cylinder portion 211, is made of a conductor, and is typically a thin cylindrical member. A piston 207a is provided in a manner of being movable in the cylinder 205 in a longitudinal direction of the cylinder 205, and the piston 207a is connected to a piston rod 207b. A damping force generation mechanism 209 generates a damping force when the cylinder 205, the piston 207a, and the piston rod 207b move relative to one another. The cylinder portion 211 includes the cylinder 205 and the outer cylinder 206. The cylinder portion 211 and the damping force generation mechanism 209 are attached to the vehicle main body 15 side via the vehicle body side attachment member 200.

The piston rod 207b is attached to the rear wheel 3 side via the wheel side attachment member 202. The guide 208 has a substantially cylindrical shape and is made of resin or the like. The guide 208 has a function of protecting the piston rod 207b inside the guide 208. The guide 208 covers the entire exposed portion of the piston rod 207b formed at the rear wheel 3 side. The guide 208 and the outer cylinder 206 move relative to each other. The guide can also be referred to as a guide tube.

As shown in FIG. 6B, the guide 208 is provided with a coil 212. In this example, the coil 212 is attached to an inner side of a thin cylindrical member constituting the guide 208. However, this is merely an example, and various attachment forms of the coil 212 are allowed. The coil 212 in FIG. 6B corresponds to the coil CL1 in FIG. 5. The outer cylinder 206 in FIG. 6B corresponds to the conductor M1 in FIG. 5.

Figure 7:
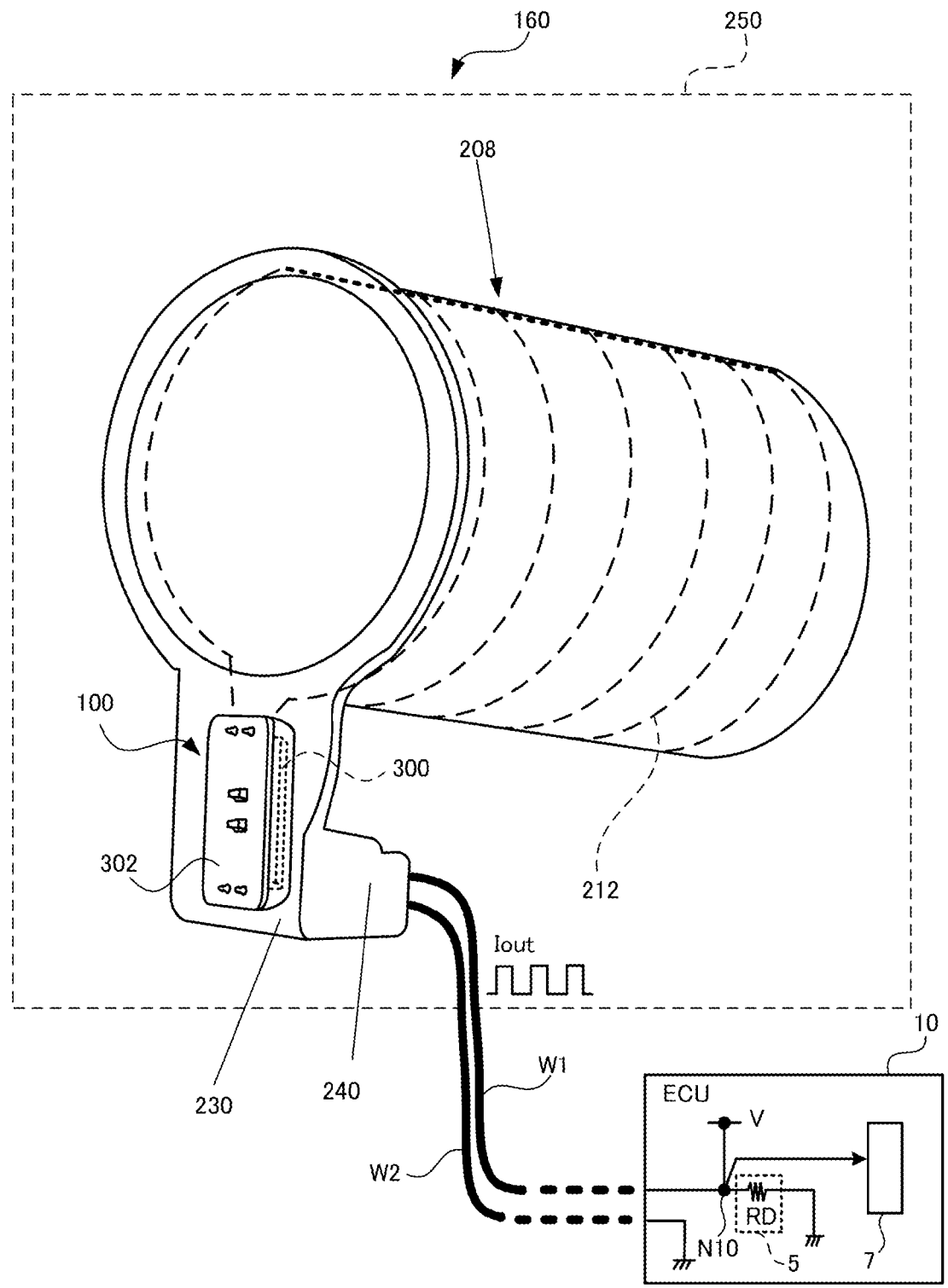
FIG. 7 is a view showing an attachment structure of a two-wire displacement sensor device in the rear suspension shown in FIG. 6A.

Next, description will be made with reference to FIG. 7. FIG. 7 is a view showing an attachment structure of a two-wire displacement sensor device in the rear suspension shown in FIG. 6A. In FIG. 7, the same components as those in FIGS. 6A and 6B are denoted by the same reference numerals.

As shown in FIG. 7, the coil 212 constituting the LC oscillation circuit is attached to the outer cylinder 208 serving as a cylindrical body, and the sensor main body 100 including the oscillation unit 102 of the LC oscillation circuit is formed on a circuit board 300. The coil 212 is indicated by a broken line in the drawing. The circuit board 300 is fixed to an extending portion 230 that extends outward in a radial direction at an end portion of the outer cylinder 208 serving as a cylindrical body. The sensor main body 100 can be integrated with the coil 212 without difficulty by fixing the sensor main body 100 to the extending portion 230.

The circuit board 300 is sealed by a sealing material 302 such as a resin at the extending portion 230. Accordingly, the circuit board 300 is protected from foreign matter, moisture, and the like. Therefore, the reliability of the sensor main body 100 is improved.

The extending portion 230 is provided with a wire pull-out portion 240 that is continuous with the extending portion 230, and two wire harnesses W1 and W2 are pulled out from the wire pull-out portion 240. Since the wire pull-out portion 240 is provided, the wire harnesses W1 and W2 can be easily pulled out in a predetermined direction. Tip end portions of the wire harnesses W1 and W2 are connected to, for example, the ECU 10 serving as a control unit shown in FIG. 1. The wire harnesses W1 and W2 correspond to the connection lines 20 and 21 in FIG. 1. The wire harness W1 transmits the current pulse signal Iout output from the sensor main body 100 shown in FIG. 1 to the ECU 10. The current pulse signal Iout is a detection output signal.

In addition, an outer cylinder 220, the coil 212, and the sensor main body 100 provided and sealed on one surface of the extending portion 240 implements a stroke sensor device 250 serving as an integrated suspension component. A circuit board 300 is built in the sensor main body 100. The stroke sensor device 250 is excellent in space saving and contributes to miniaturization of the entire system for detecting a displacement. Since the sensor main body 100 is integrated with the coil 212, the sensor main body 100 can be easily handled by an operator, and costs can be reduced. The one surface of the extending portion 240 can also be referred to as a main surface.

According to the configuration in FIG. 7, it is possible to easily achieve a suspension displacement detection system 160 that is small in size and low in costs, that is suitable for being mounted on a straddle type vehicle such as a motorcycle, a motor tricycle, and a buggy, and that detects displacement of the suspension 22. The suspension displacement detection system can also be referred to as a shock absorber displacement detection system in a broad sense.

According to the configuration in FIG. 7, the circuit board 300 is integrated with the coil 212. In other words, the sensor main body 100 is integrated with the coil 212. Therefore, a length of a wire that connects the coil 212 and the circuit board 300 is extremely short. Therefore, a signal is less likely to be affected by noises. In addition, since the circuit board 300 is disposed in the vicinity of the coil 212, when an environmental temperature is measured by the circuit board 300, the measured temperature can be substantially estimated as an environmental temperature of the coil 212. Therefore, more accurate frequency information can be obtained by estimating a characteristic of the coil 212, that is, an increase or a decrease of an inductance value of the coil 212 based on the measured temperature and correcting measured frequency information based on the estimation. According to the configuration in FIG. 7, such an effect can also be expected. The coil may be referred to as a sensor coil.

Although the present invention has been described based on the embodiment described above, the present invention is not limited to the embodiment, and various modifications and applications are possible. For example, the two-wire displacement sensor device according to the present invention is also applicable to a shock absorber that generates a damping force when a piston is displaced. The sensor can also be used to measure a positional deviation of an object from a normal position. Although the detection output signal in the embodiment described above is a current pulse signal which is a signal of a current waveform having two large and small values, the detection output signal may be a current pulse having multiple values of, for example, two or more values. Instead of outputting the current pulse signal having the frequency information, an electric signal of another format may be generated based on the current pulse signal, and the generated electric signal may be output. In this case, the electric signal can be regarded as the detection output signal according to the present invention. The object is an object to be measured by the sensor, and may be simply referred to as an object, or may be referred to as an object to be measured. Specifically, the shock absorber is, for example, a front fork, a rear damper device, or the like, in addition to a rear suspension of a motorcycle or the like.

Second Embodiment

A two-wire displacement sensor device 113 according to a second embodiment will be described with reference to FIG. 8. The two-wire displacement sensor device 113 and a displacement detection system using the sensor device according to the second embodiment are different from those according to the first embodiment in that the layout of the two constant current sources according to the first embodiment shown in FIG. 3 is changed to a layout shown in FIG. 8. Other configurations are the same as those according to the first embodiment, and description thereof will be omitted.

Figure 8:
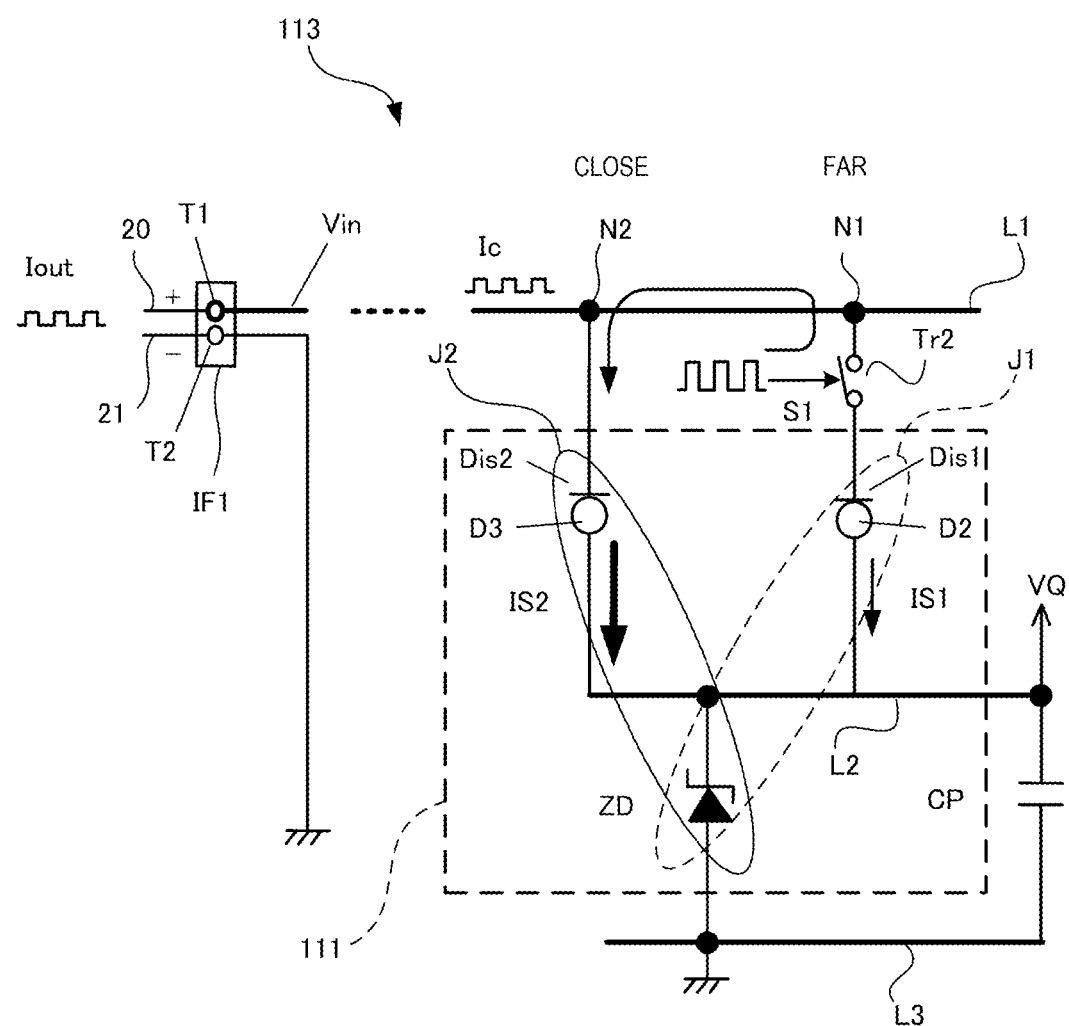
FIG. 8 is a diagram showing another example (a second embodiment) of a layout of the two constant current sources shown in FIG. 2.

FIG. 8 is a diagram showing an example of a layout of the two constant current sources shown in FIG. 2 according to the second embodiment in a similar manner to the first embodiment shown in FIG. 3. In other words, FIG. 8 is a diagram showing another example of the layout of the two constant current sources. In FIG. 8, the same reference numerals are given to the same components as those in the above-described drawings. In FIG. 8, for convenience of explanation, the first constant current circuit J1 is surrounded by a dashed ellipse. The second constant current circuit J2 is surrounded by a solid ellipse. In FIG. 8, the transistor Tr2 is simplified as a switch.

As described above, the interface unit 108 has the input and output terminal T1 that is connected to the first wire L1, inputs a direct current power supply voltage, and outputs an alternating current signal having a current waveform. In the example of FIG. 3, the connection point N2 between the second constant current circuit J2 and the first wire L1 is provided at a position farther away from the input and output terminal T1 than the connection point N1 between the first constant current circuit J1 and the first wire L1.

The layout in FIG. 8 is opposite to that in FIG. 3. That is, the connection point N1 is located farther away from the terminal T1 than the connection point N2. In this case, the second constant current circuit J2 is present between the first constant current circuit J1 and the ECU-side interface IF1. Therefore, the current pulse signal Ic generated by turning on or turning off the first constant current circuit is attenuated by a current drawn by the second constant current circuit J2. The current drawn by the second constant current circuit J2 is a large current in most cases. Therefore, the detection output signal Iout in which attenuation occurs to some extent is obtained from the terminal T11. It can be said that the layout in FIG. 3 is more preferable than the layout in FIG. 8. However, the layout of FIG. 8 is not excluded in the present invention. This is because it may be assumed that the layout according to the second embodiment shown in FIG. 8 needs to be adopted in an actual circuit design. However, when a free layout is allowed, it is preferable to adopt the layout according to the first embodiment shown in FIG. 3. The ECU-side interface IF1 is a first interface.

Third Embodiment

A two-wire displacement sensor device 115 according to a third embodiment will be described with reference to FIG. 9. The two-wire displacement sensor device 115 and a displacement detection system using the sensor device according to the third embodiment are different from those according to the first embodiment in that the current load element according to the first embodiment shown in FIG. 4A is changed to a load resistor RL in FIG. 9. Other configurations are the same as those according to the first embodiment. Therefore, description of the other configurations will be omitted. In the first embodiment, one Zener diode ZD is used as a current load element.

Figure 9:
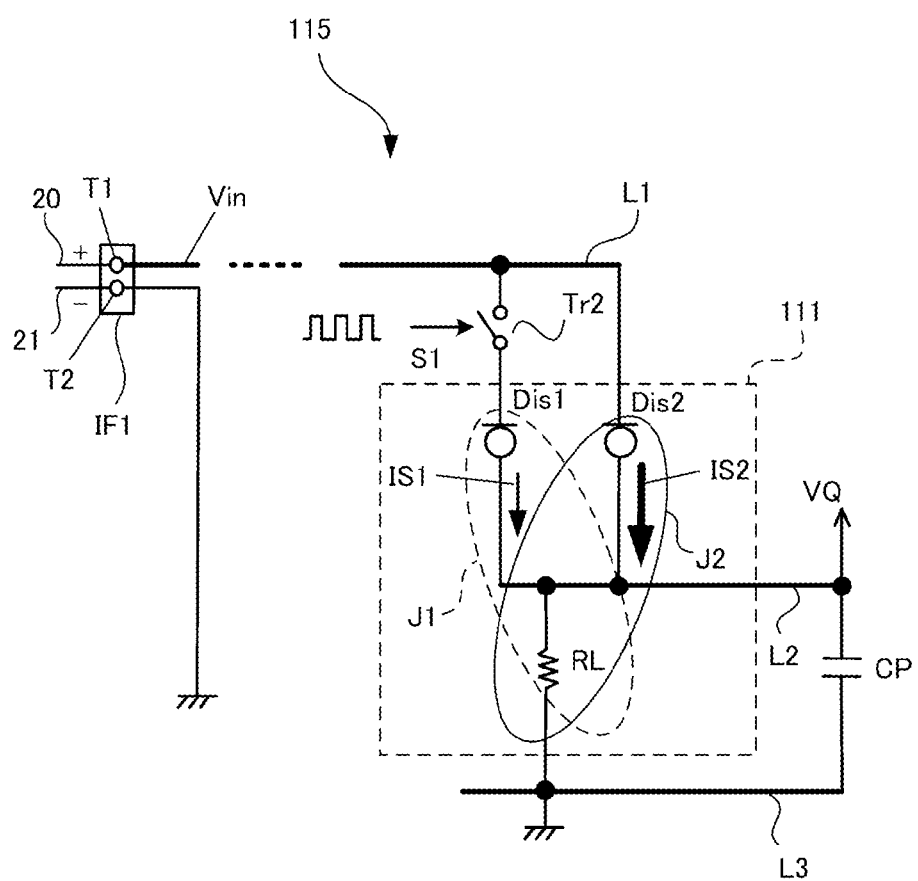
FIG. 9 is a diagram showing another example (a third embodiment) of a circuit configuration of a main part of the interface unit shown in FIG. 2.

In FIG. 9, at least one resistor is used as a current load. Here, the load resistor RL is used. The load resistor RL in FIG. 9 is an element serving as a current load that is connected between the second wire L2 and the reference potential line L3 in a similar manner to the Zener diode ZD in FIG. 4A. The load resistor RL is also current-biased by a total current obtained by adding the current IS1 and the current IS2, and has a function of generating a voltage. The smoothing capacitor CP is biased by the generated voltage, and the power supply voltage VQ for the sensor main body is generated at a connection point between the smoothing capacitor CP and the second wire L2. It is possible to control the value of the voltage VQ to a desired value by adjusting at least one of a total current amount and a resistance value of the load resistor RL. As described above, the desired value is, for example, 5V.

In FIG. 9, a constant current amount of the current IS2 of the second constant current circuit J2 is set to be larger than a constant current amount of the current IS1 of the first constant current circuit J1 in a similar manner to FIG. 4A. Since the current IS2 that constantly flows is dominant, even when the current IS1 is switched between an ON state and an OFF state, a potential fluctuation of the first wire L1 is prevented, and potential stability is maintained within an allowable range.

The present invention is not limited to the embodiments described above, and those skilled in the art can easily modify the embodiments described above within a scope included in the claims.

INDUSTRIAL APPLICABILITY

The present invention is suitable for, for example, a two-wire displacement sensor device and a displacement detection system that measure a displacement of a suspension of a straddle type vehicle.

REFERENCE SIGNS LIST 5 current and voltage conversion unit
7 detection unit
10 ECU (control unit, signal processing unit, electronic control unit)
20, 21 connection line (wire harness and the like)

22 rear suspension (shock absorber)
100 sensor main body
102 oscillation unit
104 waveform shaping unit
106 frequency dividing unit
108 interface unit
109 LC oscillation circuit
110, 113, 115 two-wire displacement sensor device
111 constant current circuit
150 displacement detection system
160 shock absorber displacement detection system
200 vehicle body side attachment member
202 wheel side attachment member
204 coil spring
205 cylinder
206 outer cylinder (component of shock absorber)
207a piston
207b piston rod
208 guide (guide tube)
209 damping force generation mechanism
212 coil (sensor coil)
220 cylindrical body
230 extending portion
240 wire pull-out portion
250 stroke sensor device
300 circuit board
302 sealing material
C30, C31, C32 capacitor
CL1 coil (sensor coil)
CP smoothing capacitor
Dis1 first constant current source
Dis2 second constant current source
D1 reverse current prevention diode
D2, D3 constant current diode
Ic current pulse signal (alternating current signal)
IF1 ECU-side interface
IF2 coil-side interface
INV1, INV2 amplifying element
Iout detection output signal (current pulse signal)
IS1 first constant current (constant current amount of first constant current circuit)
IS2 second constant current (constant current amount of second constant current circuit)
J1 first constant current circuit
J2 second constant current circuit
L1 first wire
L2 second wire
L3 reference potential line
LT fitting length
M1 object
N1, N2 node (connection point)
Rd pull-down resistor
RL load resistor
T1, T2, T3, T4 terminal (input and output terminal)
Tr1 first switching transistor
Tr2 second switching transistor
Vin direct current power supply voltage
VQ power supply voltage for sensor main body (power supply voltage of oscillation unit)
ZD constant voltage diode (Zener diode)

What is claimed is:

1. A two-wire displacement sensor device comprising:
an LC oscillation circuit including a coil whose inductance changes in accordance with a displacement amount of an object and an oscillation unit provided with a capacitor and an amplifying element; and
an interface unit serving as a signal output unit and a power supply input unit,
wherein the interface unit includes a constant current circuit that outputs at least two current values,
wherein the constant current circuit includes
a first constant current circuit that is connected between a first wire and a second wire and is configured to output an alternating current signal having a current waveform to the first wire when the first constant current circuit is switched between an ON state and an OFF state based on an alternating current signal having a voltage waveform obtained from the LC oscillation circuit,
a second constant current circuit that is connected between the first wire and the second wire and is constantly turned on, and
a smoothing capacitor that is connected between the second wire and a reference potential line and is configured to generate a power supply voltage of the oscillation unit, and
wherein the first wire serves as a current signal output line that outputs the alternating current signal having the current waveform and a direct current power supply voltage input line to which a direct current power supply voltage is input.

2. The two-wire displacement sensor device according to claim 1,
wherein the interface unit includes an input and output terminal to which the first wire is connected, that inputs the direct current power supply voltage, and that outputs the alternating current signal having the current waveform, and
wherein a connection point between the second constant current circuit and the first wire is provided at a position farther away from the input and output terminal than a connection point between the first constant current circuit and the first wire.

3. The two-wire displacement sensor device according to claim 2,
wherein a constant current amount of the second constant current circuit is set to be larger than a constant current amount of the first constant current circuit.

4. The two-wire displacement sensor device according to claim 1,
wherein each of the first constant current circuit and the second constant current circuit is configured with at least one constant current diode.

5. The two-wire displacement sensor device according to claim 1,
wherein at least one constant voltage diode is connected between the second wire and the reference potential line,
wherein a total current obtained by adding currents flowing out from the first constant current circuit and the second constant current circuit flows to the reference potential line via the constant voltage diode to generate a predetermined constant voltage at two ends of the constant voltage diode, and a surplus current exceeding a current amount required to generate the constant voltage flows to the reference potential line, and
wherein the constant voltage generated by the constant voltage diode is smoothed by the smoothing capacitor to generate the power supply voltage of the oscillation unit.

6. The two-wire displacement sensor device according to claim 1, further comprising:

a waveform shaping unit configured to shape a waveform of the alternating current signal having the voltage waveform output from the LC oscillation circuit, wherein the first constant current circuit in the interface unit is switched between an ON state and an OFF state based on a pulse signal obtained by the waveform shaping, or further comprising:

a waveform shaping unit configured to shape a waveform of the alternating current signal having the voltage waveform output from the LC oscillation circuit; and a frequency dividing unit configured to divide a frequency of a pulse signal obtained by the waveform shaping, wherein the first constant current circuit in the interface unit is switched between an ON state and an OFF state based on the pulse signal whose frequency is divided.

7. The two-wire displacement sensor device according to claim 1, wherein the object is a component of a shock absorber, and the two-wire displacement sensor device is a stroke sensor device that measures a displacement amount of the shock absorber by detecting a frequency of the LC oscillation circuit that varies in accordance with a relative positional relationship between the component of the shock absorber and the coil.

8. The two-wire displacement sensor device according to claim 7, wherein the coil of the LC oscillation circuit is attached to a cylindrical body, wherein the oscillation unit of the LC oscillation circuit is formed on a circuit board, and wherein the circuit board is fixed to an extending portion that extends from the cylindrical body to an outer side in a radial direction of the cylindrical body.

9. The two-wire displacement sensor device according to claim 8, wherein the circuit board is sealed with a sealing material at the extending portion.

10. A displacement detection system comprising:

the two-wire displacement sensor device according to claim 1; and an electronic control unit including a current and voltage conversion unit configured to convert the alternating current signal having the current waveform output from the two-wire displacement sensor device into an alternating current signal having a voltage waveform, and a detection unit configured to detect a displacement amount of the object by observing a frequency of the alternating current signal having the voltage waveform after the conversion.

11. The displacement detection system according to claim 10, wherein the displacement detection system is a shock absorber displacement detection system that detects a displacement of a shock absorber.

12. A displacement detection system using a two-wire stroke sensor, the displacement detection system comprising:

an LC oscillation circuit including a coil whose inductance changes in accordance with a stroke amount of a shock absorber of a straddle type vehicle and an oscillation unit provided with a capacitor and an amplifying element;

an interface unit serving as a signal output unit that outputs an alternating current signal having a current waveform to a first wire and a power supply input unit to which a direct current power supply voltage is input;

a current and voltage conversion unit configured to convert the alternating current signal having the current waveform into an alternating current signal having a voltage waveform; and an electronic control unit including a detection unit configured to detect the stroke amount by observing a frequency of the alternating current signal having the voltage waveform after the conversion, wherein the interface unit includes a first constant current circuit that is connected between the first wire and a second wire and is configured to output an alternating current signal having a current waveform to the first wire when the first constant current circuit is switched between an ON state and an OFF state based on an alternating current signal having a voltage waveform obtained from the LC oscillation circuit, a second constant current circuit that is connected between the first wire and the second wire and is constantly turned on, and a smoothing capacitor that is connected between the second wire and a reference potential line and is configured to generate a power supply voltage of the oscillation unit, wherein the first wire serves as a current signal output line that outputs the alternating current signal having the current waveform and a direct current power supply voltage input line to which the direct current power supply voltage is input, wherein the interface unit includes an input and output terminal to which the first wire is connected, that inputs the direct current power supply voltage, and that outputs the alternating current signal having the current waveform, wherein a connection point between the second constant current circuit and the first wire is provided at a position farther away from the input and output terminal than a connection point between the first constant current circuit and the first wire, wherein a constant current amount of the second constant current circuit is set to be larger than a constant current amount of the first constant current circuit, wherein each of the first constant current circuit and the second constant current circuit is configured with at least one constant current diode, wherein the interface unit includes at least one Zener diode connected between the second wire and a reference potential line, wherein a total current obtained by adding currents flowing out from the first constant current circuit and the second constant current circuit flows to the reference potential line via the Zener diode to generate a predetermined constant voltage at two ends of the Zener diode, and a surplus current exceeding a current amount required to generate the constant voltage flows to the reference potential line, and wherein the constant voltage generated by the Zener diode is smoothed by the smoothing capacitor to generate the power supply voltage of the oscillation unit.

* * * * *